(12) United States Patent
Kim et al.

(10) Patent No.: US 8,963,205 B2
(45) Date of Patent: Feb. 24, 2015

(54) METHOD FOR FABRICATING A SEMICONDUCTOR DEVICE

(75) Inventors: Yong-Soo Kim, Ichon-shi (KR); Jun-Ki Kim, Ichon-shi (KR); Se-Aug Jang, Ichon-shi (KR)

(73) Assignee: SK hynix Inc., Icheon-si (KR)

( * ) Notice: Subject to any disclaimer, the term of this patent is extended or adjusted under 35 U.S.C. 154(b) by 442 days.

(21) Appl. No.: 12/165,164

(22) Filed: Jun. 30, 2008

(65) Prior Publication Data

US 2009/0121235 A1 May 14, 2009

(30) Foreign Application Priority Data

Nov. 9, 2007 (KR) .......................... 10-2007-0114068

(51) Int. Cl.
| | |
|---|---|
| *H01L 29/66* | (2006.01) |
| *H01L 29/10* | (2006.01) |
| *H01L 21/8238* | (2006.01) |
| *H01L 29/78* | (2006.01) |

(52) U.S. Cl.
CPC .... *H01L 29/1054* (2013.01); *H01L 21/823807* (2013.01); *H01L 29/66651* (2013.01); *H01L 29/7843* (2013.01)
USPC .............................. 257/192; 257/288; 257/369

(58) Field of Classification Search
CPC ...................... H01L 29/1054; H01L 29/66651; H01L 29/7843; H01L 21/823807
USPC .......... 438/199; 257/287, 288, 345, 349, 369, 257/372, 376, 616, 629, 648, 652, E29.016, 257/E29.49, E29.056, E29.193, 18, 19, 257/183, 190, 192, 65, 66
See application file for complete search history.

(56) References Cited

U.S. PATENT DOCUMENTS

| | | | | |
|---|---|---|---|---|
| 6,563,152 | B2 * | 5/2003 | Roberds et al. ............... | 257/288 |
| 6,881,987 | B2 * | 4/2005 | Sohn .............................. | 257/192 |
| 6,936,869 | B2 * | 8/2005 | Webb et al. ................... | 257/192 |
| 2005/0085022 | A1 * | 4/2005 | Chidambarrao et al. ..... | 438/151 |
| 2005/0106792 | A1 * | 5/2005 | Cea et al. ...................... | 438/197 |
| 2005/0189589 | A1 * | 9/2005 | Zhu et al. ...................... | 257/347 |

(Continued)

FOREIGN PATENT DOCUMENTS

| | | |
|---|---|---|
| EP | 1 672 700 A2 | 6/2006 |
| JP | 02-215125 | 8/1990 |

(Continued)

OTHER PUBLICATIONS

Lee et al., "Fin-Channel-Array Transistor (FCAT) Featuring Sub-70nm Low Power and High Performance DRAM," *IEDM Tech. Dig.*, pp. 407-410 (2003).

(Continued)

*Primary Examiner* — Colleen A Matthews
*Assistant Examiner* — Quovaunda V Jefferson
(74) *Attorney, Agent, or Firm* — Kilpatrick Townsend & Stockton LLP

(57) ABSTRACT

A transistor of a semiconductor device includes a substrate, a gate over the substrate, a source/drain region formed in the substrate to have a channel region therebetween, and an epitaxial layer formed below the channel region to have a different lattice constant from the substrate. The epitaxial layer having a different lattice constant with a substrate material is formed below the channel region to apply a stress to the channel region. Thus, the mobility of carriers of the transistor increases.

20 Claims, 10 Drawing Sheets

(56) References Cited

U.S. PATENT DOCUMENTS

| | | | |
|---|---|---|---|
| 2005/0285212 A1* | 12/2005 | Tolchinsky et al. | 257/408 |
| 2007/0001222 A1* | 1/2007 | Orlowski et al. | 257/347 |
| 2007/0048907 A1* | 3/2007 | Lee et al. | 438/142 |
| 2008/0116482 A1* | 5/2008 | Chong et al. | 257/190 |
| 2012/0025267 A1* | 2/2012 | Huang et al. | 257/192 |
| 2012/0168864 A1* | 7/2012 | Dennard et al. | 257/347 |

FOREIGN PATENT DOCUMENTS

| | | |
|---|---|---|
| JP | 2007-227421 | 9/2007 |
| KR | 1020020054108 A | 7/2002 |
| KR | 100539269 B1 | 12/2005 |
| KR | 100639032 B1 | 10/2006 |

OTHER PUBLICATIONS

Lee et al., "Improvement of Data Retention Time in DRAM using Recessed Channel Array Transistors with Asymmetric Channel Doping for 80 nm feature size and beyond," *ESSDERC*, p. 449-452 (2004).

Oishi et al., "High Performance CMOSFET Technology for 45 nm Generation and Scalability of Stress Induced Mobility Enhancement Technique," *IEDM* (2005).

Thompson et al., "A 90-nm Logic Technology Featuring Strained-Silicon," *IEEE ED* 51:1790-1797 (2004).

Tyagi et al., "An advanced low power, high performance, strained channel 65 nm technology," *IEDM* (2005).

* cited by examiner

⟨ TOP VIEW ⟩

⟨ CROSS-SECTIONAL VIEW ⟩

[1]

METHOD FOR FABRICATING A SEMICONDUCTOR DEVICE

CROSS-REFERENCE TO RELATED APPLICATIONS

The present invention claims priority of Korean patent application number 2007-0114068, filed on Nov. 9, 2007, which is incorporated by reference in its entirety.

BACKGROUND OF THE INVENTION

The present invention relates to a method for fabricating a semiconductor device and, more particularly, to a transistor of a semiconductor device and a method for fabricating the same.

As semiconductor devices are becoming more highly integrated, a method for fabricating a transistor which can secure high current drivability and a short channel margin in a small area emerges as an important matter. Particularly, securing high current drivability is essential for high-speed and low-power devices.

Recently, research for increasing mobility of carriers has been actively conducted to secure high current drivability. A certain level stress is applied to a channel region below a gate to increase the mobility of the carriers. Thus, on-current of a transistor increases. Carriers in P-type metal oxide semiconductor (PMOS) transistor are holes while carriers in N-type MOS (NMOS) transistor are electrons. Thus, the PMOS and the NMOS have different structures for increasing carrier mobility.

FIG. 1 is a cross-sectional view of a structure of a typical PMOS transistor.

Referring to FIG. 1, an isolation layer 11 is formed over a substrate 10 to define an active region.

A gate 12 having a stack structure of a gate insulation layer 12A, a gate electrode 12B, and a gate hard mask layer 12C is formed over the substrate 10. Gate spacers 13 are formed on sidewalls of the gate 12.

Portions of the substrate 10 beside the gate spacers 13 are etched to a certain depth to form a recess R in a source/drain region of the substrate 10. Then, an epitaxial layer 14 is formed to fill the recess R. Since a compressive stress should be applied in a direction parallel to the channel region to increase the mobility of the holes, i.e., carriers, the epitaxial layer 14 includes a material having a larger lattice constant than that of the substrate 10. For instance, when the substrate 10 is a silicon (Si) substrate, the epitaxial layer 14 may include silicon germanium (SiGe) epitaxial layer.

An additive stress may be applied to the channel region by forming a compressive stress layer 15 over a resultant structure including the gate spacers 13 and the epitaxial layer 14.

When the PMOS transistor is fabricated according to the method described above, an epitaxial layer is formed to have the lager lattice constant than that of the substrate in the source/drain region. Thus, the compressive stress is applied in the direction parallel to the channel region, thereby increasing the mobility of the holes.

However, as semiconductor devices are becoming more highly integrated, gate pitch is decreasing. Thus, saturation current (Isat) gain of PMOS transistors is rapidly decreasing (refer to FIG. 2, proposed in an article by S. Tyagi, C. Auth et al, entitled "An Advanced low power high performance, strained channel 65 nm technology", IEDM, 2005). The area of source/drain regions where the epitaxial layer is formed decreases as the gate pitch deceases. Thus, when it comes to increasing the mobility of the carriers in the PMOS transistor, the typical method illustrated in FIG. 1 is not an effective way to increase current rate.

FIG. 3 is a cross-sectional view of a structure of a typical NMOS transistor.

Referring to FIG. 3, an isolation layer 31 is formed over a substrate 30 to define an active region of the substrate 30.

A gate 32 having a stack structure of a gate insulation layer 32A, a gate electrode 32B, and a gate hard mask layer 32C is formed over the substrate 30. Gate spacers 33 are formed over sidewalls of the gate 32.

A tensile stress layer 34 is formed over a resultant structure including the gate 32 and the gate spacers 33 to induce a lattice mismatch, thereby applying a tensile stress in a direction parallel to a channel region. Thus, the mobility of electrons, i.e., carriers, increases in the NMOS transistor.

However, as semiconductor devices are becoming more highly integrated, gate pitch decreases. Thus, the thickness Tx of the tensile stress layer formed between gates increases, thereby decreasing a stress effect Sxx rapidly (refer to FIG. 4). This is disclosed in an article by A. Oishi, O. Fujii et al, entitled "High performance CMOSFET Technology for 45 nm Generation and Scalability of Stress-Induced Mobility Enhancement Technique", IEDM, 2005. The typical method illustrated in FIG. 3 also is not an effective way to increase current and increase the mobility of the carriers in the NMOS transistor.

In sum, as semiconductor devices are becoming more highly integrated, the pitch of the gate decreases. Thus, the typical method for forming a filling SiGe epitaxial layer in the source/drain region of a PMOS transistor or the typical method for forming the tensile stress layer over a NMOS transistor exhibits decreased carrier mobility.

SUMMARY OF THE INVENTION

Embodiments of the present invention are directed to providing a method for fabricating semiconductor device.

In accordance with an aspect of the present invention, a transistor of a semiconductor device includes a substrate, a gate over the substrate, a source/drain region formed in the substrate having a channel region therebetween, and an epitaxial layer formed below the channel region having a different lattice constant from the substrate.

In accordance with another aspect of the present invention, a transistor of a semiconductor device includes a substrate including a PMOS region and an NMOS region, a gate over the substrate, a source/drain region formed in the substrate having a channel region therebetween, a first epitaxial layer formed below the channel region of the PMOS region having a smaller lattice constant than the substrate, and a second epitaxial layer formed below the channel region of the NMOS region having a greater lattice parameter. A PMOS transistor is formed in the PMOS region and a NMOS transistor is formed in the NMOS region.

In accordance with still another aspect of the present invention, a method for fabricating a transistor of a semiconductor device includes forming a recess by etching a substrate using a mask pattern exposing a channel target region, and forming an epitaxial layer having a different lattice constant from the substrate by performing a selective epitaxial growth process to fill the recess.

In accordance with a further aspect of the present invention, a method for fabricating a transistor of a semiconductor includes providing a substrate including a first region and a second region, forming a first recess by etching the substrate using a mask pattern exposing a target channel region of the substrate, forming a first epitaxial layer to fill the first recess by performing a selective epitaxial growth process, forming a capping layer over a resultant structure, forming a second recess by etching the capping layer and the substrate using a mask pattern exposing the channel target region of the second region, removing the capping layer, forming an epitaxial substrate over a resultant structure, forming a gate over the epitaxial substrate, and forming a source/drain region having a channel region therebetween over the epitaxial substrate. The substrate, the first epitaxial layer and the second epitaxial layer have different lattice constants.

DESCRIPTION OF SPECIFIC EMBODIMENTS

Embodiments of the present invention are directed to a method for fabricating a semiconductor device. Before describing a transistor structure of a semiconductor device and a method for fabricating the same, a stress direction for increasing a mobility of holes, i.e., carriers of a PMOS transistor, an on-current increment corresponding to an equal size of stress and a stress direction for increasing electrons, i.e., carriers of an NMOS transistor, and an on-current increment corresponding an equal size of stress will be described with reference to Table 1. Table 1 describes a channel that is formed over a Si substrate.

TABLE 1

|  | Channel Direction (X) | Direction Perpendicular to Channel (Z) |
| --- | --- | --- |
| NMOS transistor | Tensile stress +++ | Compressive stress ++++ |
| PMOS transistor | Compressive stress ++++ | Tensile stress + |

Referring to Table 1, in a channel region of the NMOS transistor, a tensile stress is applied in a channel direction which is X direction in FIG. 5, and a compressive stress is applied to increase a mobility of electrons. Particularly, the compressive stress applied in a direction perpendicular to the channel increases the on-current. In a channel region of the PMOS transistor, a compressive stress is applied in a channel direction, i.e., the X direction, and a tensile stress is applied in a direction perpendicular to the channel, i.e., a Z direction, to increase a mobility of holes. It can be seen from Table 1 that the compressive stress applied in the direction perpendicular to the channel has more influence on the increase of the on-current.

A transistor structure for increasing the mobility of the carriers and a method for fabricating the same will be described based on Table 1.

Figure 1:
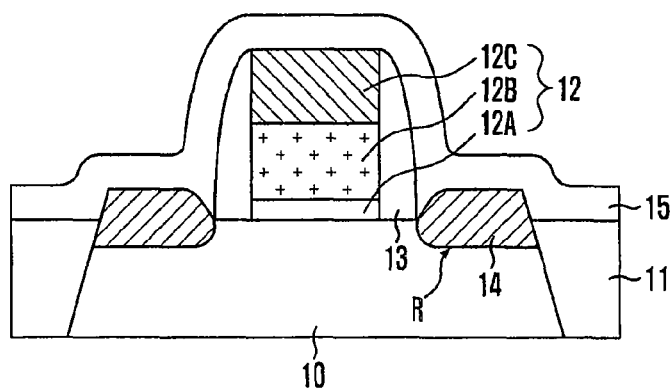
FIG. 1 is a cross-sectional view of a structure of a typical PMOS transistor
Figure 2:
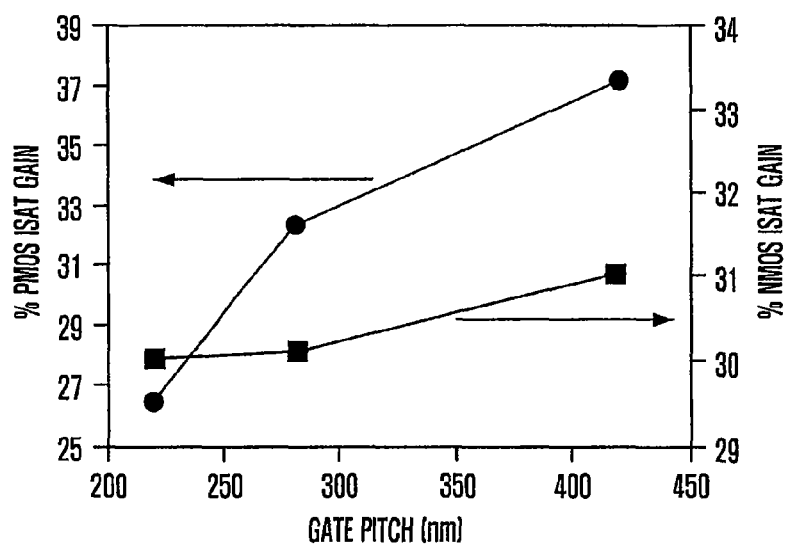
FIG. 2 shows a shortcoming of the PMOS transistor shown in FIG. 1.
Figure 3:
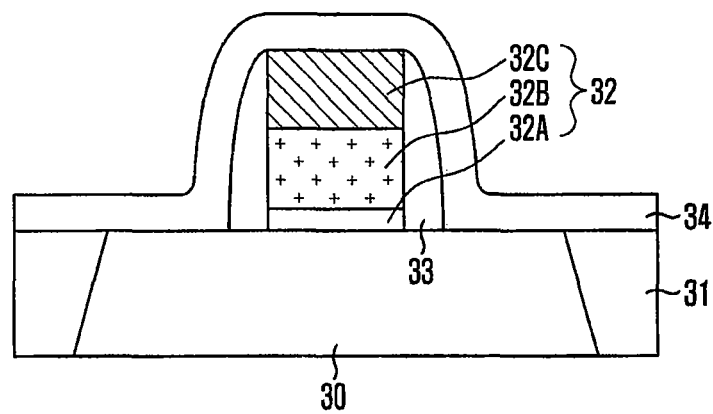
FIG. 3 is a cross-sectional view of a structure of a typical NMOS transistor.
Figure 4:
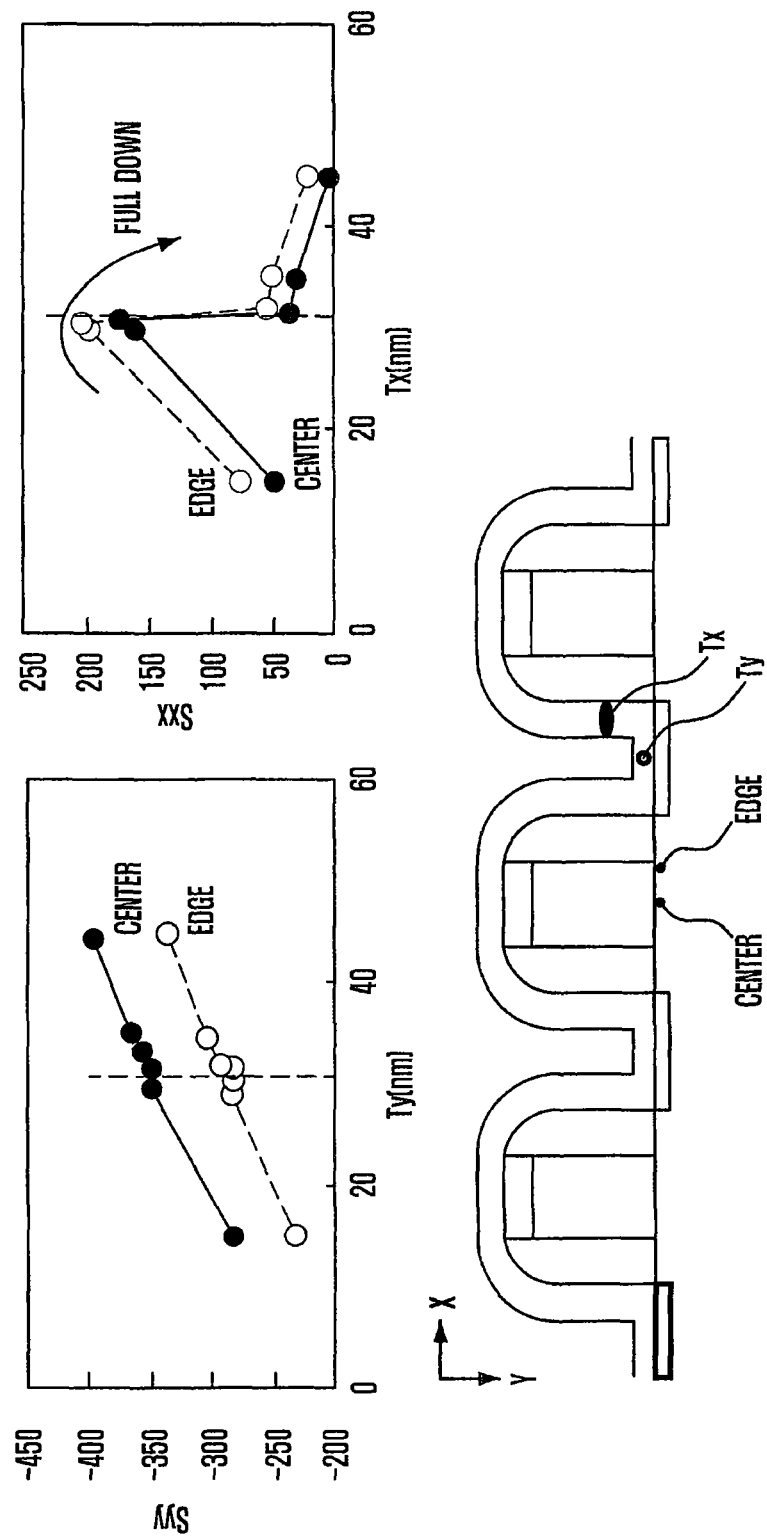
FIG. 4 shows a shortcoming of the PMOS transistor shown in FIG. 3.
Figure 5A:
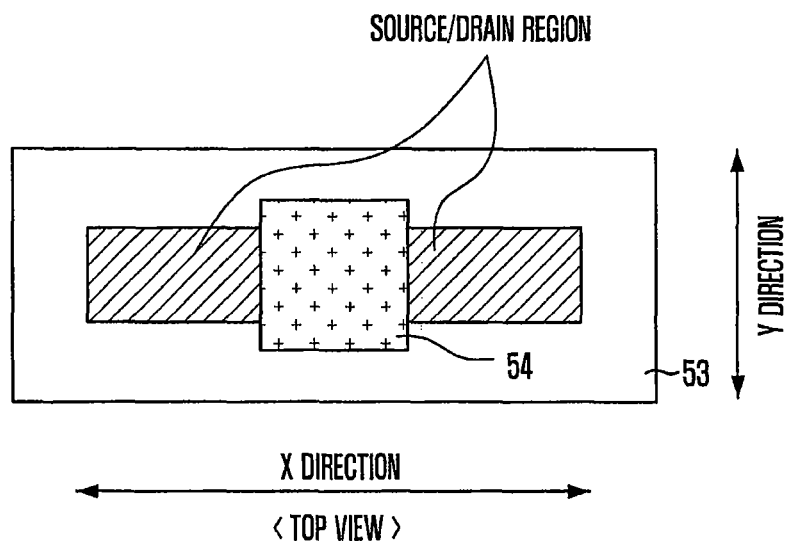
FIGS. 5A and 5B are plane views and a cross-sectional view of a transistor structure of a semiconductor device in accordance with an embodiment of the present invention.
Figure 5B:
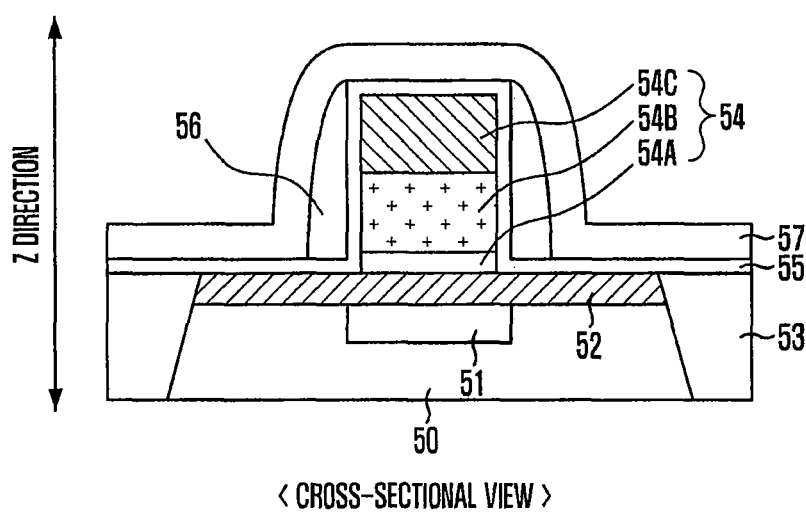

FIGS. 5A and 5B show a plane view and a cross-sectional view of a transistor structure of a semiconductor device in accordance with an embodiment of the present invention.

Referring to FIGS. 5A and 5B, an epitaxial layer 52 is formed over a substrate 50. When the substrate is a Si substrate, the epitaxial substrate 52 is a Si epitaxial layer. A thickness of the epitaxial substrate 52 may range from approximately 100 Å to approximately 500 Å.

The substrate 50 and the epitaxial substrate 52 have an active region defined by an isolation layer 53 formed in an isolation region.

A gate 54 having a stack structure of a gate insulation layer 54A, a gate electrode 54B, and a gate hard mask layer 54C is formed over the epitaxial substrate 52. A source/drain region (not shown) is formed in the epitaxial substrate 52 beside the gates 54 by performing a source/drain ion implanting process. A channel region (not shown) is formed between the source/drain regions, that is, in the epitaxial substrate 52 below the gate 54.

In the substrate 50, an epitaxial layer 51 is formed below the channel region of the epitaxial substrate 52. The epitaxial layer 51 includes a material having a different lattice constant from those of the substrate 50 and the epitaxial substrate 52, thereby applying stress to the channel region. Thus, the mobility of the carriers in the transistor increases.

When a PMOS transistor is fabricated, compressive stress is applied in the channel direction, i.e., the X direction, and the tensile stress is applied in the direction perpendicular to the channel, i.e., the Z direction, in order to increase the mobility of the holes, which is described in the Table 1. Thus, the epitaxial layer 51 should include a material having a smaller lattice constant than those of the substrate 50 and the epitaxial substrate 52. The epitaxial layer 51 having a small lattice constant induces a lattice mismatch of the channel region of the epitaxial substrate 52. That is, the size of a lattice decreases in the channel direction and increases in the direction perpendicular to the channel. Thus, the compressive stress is applied in the channel direction and the tensile stress is applied in the direction vertical to the channel. The mobility of the holes increases, thereby improving the on-current characteristic of the transistor. When the PMOS substrate 50 is a Si substrate and the epitaxial substrate 52 is a Si epitaxial layer, the epitaxial layer 51 having a smaller lattice than the epitaxial substrate 52 may be a silicon carbide (SiC) epitaxial layer. Particularly, a content of C in the SiC epitaxial layer may not be more than 2%.

When an NMOS transistor is fabricated, the tensile stress is applied in the channel direction, i.e., the X direction, and the compressive stress is applied in the direction perpendicular to the channel, i.e., the Z direction, in order to increase the mobility of the electrons. Thus, the epitaxial layer 51 includes a material having a greater lattice constant than those of the substrate 50 and the epitaxial substrate 52. The epitaxial layer 51 having a large lattice constant induces a lattice mismatch. That is, the size of the lattice increases in the channel direction and decreases in the direction perpendicular to the channel. Thus, the tensile stress is applied in the channel direction and the compressive stress is applied in the direction perpendicular to the channel. The mobility of the electrons increases, thereby improving the on current characteristic of the NMOS transistor. When the substrate 50 is a Si substrate and the epitaxial substrate 52 is a Si epitaxial layer, the epitaxial layer 51 having a greater lattice than the substrate 50 and the epitaxial substrate 52 may be a SiGe epitaxial layer. Particularly, the Ge content in the SiGe epitaxial layer may not exceed 50%.

An etch stop layer 55 including a nitride layer may be formed along a profile of a resultant structure including the gate 54. The etch stop layer 55 may be omitted. Gate spacers 56 are formed on sidewalls of the gate 54.

A stress layer 57 may be formed over a resultant structure including the gate 54 and the gate spacer 56 to apply an additive stress to the channel region. When fabricating a PMOS transistor, the stress layer 57 may be a $Si_3N_4$ layer having a compressive stress. When fabricating an NMOS transistor, the stress layer 57 may be a silicon nitride ($Si_3N_4$) layer having a tensile stress.

FIGS. 6A to 6D are cross-sectional views describing a method for fabricating a transistor of a semiconductor device in accordance with an embodiment of the present invention.

Figure 6A:
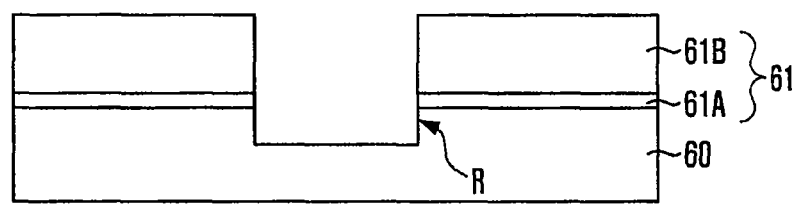
FIGS. 6A to 6D are cross-sectional views describing a method for fabricating a transistor of a semiconductor device in accordance with an embodiment of the present invention.

Referring to FIG. 6A, a hard mask pattern 61 is formed over a substrate 60 to expose a region where a channel is to be formed. The hard mask pattern 61 has a stack structure of an oxide layer 61A and a nitride layer 61B. The oxide layer 61A and the nitride layer 61B are formed to have a thickness of approximately 50 Å to approximately 500 Å.

The substrate 60 is etched to a certain depth, using the hard mask pattern 61 as an etch barrier to form a recess R in the substrate 60. The depth of the recess R may range from approximately 300 Å to approximately 1,000 Å.

Figure 6B:
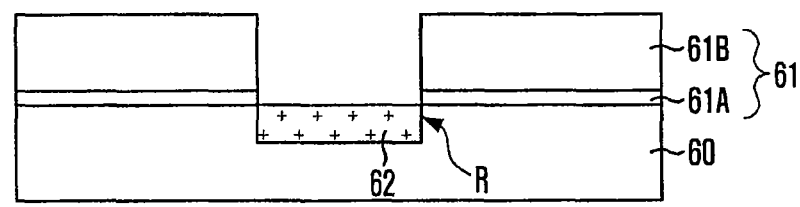

Referring to FIG. 6B, the substrate 60 with a recess R is treated with heat over approximately 800° C. in a hydrogen ($H_2$) atmosphere to remove a natural oxide layer generated when the recess R is formed. A selective epitaxial growth process is performed to form an epitaxial layer 62 filling the recess R. The thickness of the epitaxial layer 62 may be substantially the same as the depth of the recess R.

When a PMOS transistor is fabricated, the epitaxial layer 62 has a greater lattice constant than the substrate 60. To be specific, when the substrate 60 is a Si substrate, the epitaxial layer 62 may be a SiC epitaxial layer. Particularly, the content of C in the SiC epitaxial layer may be more than 2%. A SiC epitaxial layer formation process is performed using monosilane ($SiH_4$), dichlorosilane ($Si_2H_6$), or disilane ($Si_2H_6$) as a Si source and methane ($CH_4$) or monomethyl silane ($SiH_3$($CH_3$)) as a C source.

When an NMOS transistor is fabricated, the epitaxial layer 62 should have a greater lattice constant than the substrate 60. To be specific, when the substrate 60 is a Si substrate, the epitaxial layer 62 may be a SiGe epitaxial layer. Particularly, the content of Ge in the SiGe epitaxial layer may not be more than 50%. A SiGe epitaxial layer formation process may be performed using $SiH_4$, dichlorosiline ($Si_2H_2Cl_2$), or $Si_2H_6$ as a Si source and germane ($GeH_4$) as a Ge source.

Figure 6C:
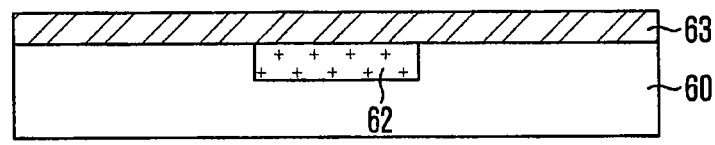

Referring to FIG. 6C, the oxide layer 61A and the nitride layer 61B are removed using a wet chemical including hypophosphoric acid ($H_2PO_3$) and hydrogen peroxide ($H_2O_2$) or a wet chemical including hydrogen fluoride (HF).

An epitaxial substrate 63 is formed over the substrate 60 including the epitaxial layer 62. When the substrate 60 is a Si substrate, the epitaxial substrate 63 is a Si epitaxial layer. The thickness of the epitaxial substrate 63 may range from approximately 100 Å to approximately 500 Å. A source/drain region is formed over the epitaxial substrate layer 63 and a channel region is formed between the source/drain regions. Thus, the epitaxial layer 62 is formed below the channel region and a stress is applied to the channel region.

Figure 6D:
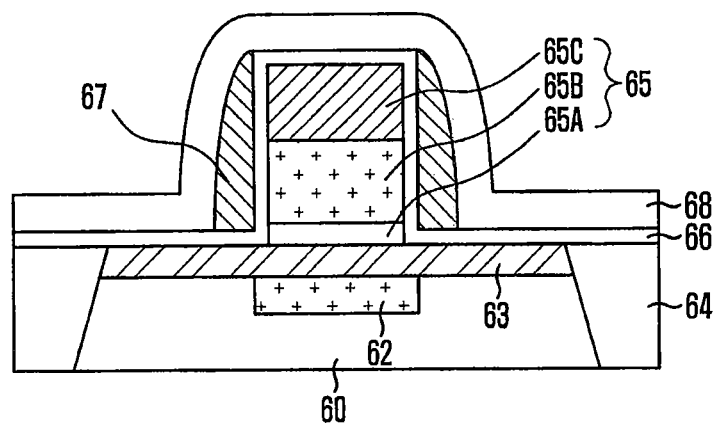

Referring to FIG. 6D, an isolation layer 64 is formed through an isolation process.

A gate 65 having a stack structure of a gate insulation layer 65A, a gate electrode 65B, and a gate hard mask layer 65C is formed over the channel region.

An etch stop layer 66 is formed along a profile of a resultant structure including the gate 65. The etch stop layer 66 prevents the substrate 60 from being damaged when an etch process for forming gate spacers is performed. The etch stop layer 66 may include a nitride layer. However, the etch stop layer 66 may be omitted.

An isolation layer for gate spacers is formed over the etch stop layer 66 and a spacer etch process is performed until the etch stop layer 66 is exposed, thereby forming gate spacers 67 on sidewalls of the gate 65.

A stress layer 68 may be formed over a resultant structure including the gate 65 and the gate spacers 67 to apply an additive stress to the channel region. When a PMOS transistor is fabricated, the stress layer 68 may be a $Si_3N_4$ layer having a compressive stress. However, when an NMOS transistor is fabricated, the stress layer 68 may be a $Si_3N_4$ layer having a tensile stress.

Referring back to FIGS. 5A and 5B, the described transistor structure is formed in both NMOS and PMOS regions in a core/peripheral region of the semiconductor device, thereby embodying a high-speed and low-power device. That is, in the NMOS region, the NMOS transistor including the epitaxial layer having a large lattice constant, e.g., the SiGe, is formed below the channel region. In the PMOS region, the PMOS transistor including the epitaxial layer having a small lattice constant, e.g., a SiC, is formed below the channel region. The semiconductor device including the NMOS and PMOS transistors may be any type of semiconductor device and is not described. Hereinafter, a method for simultaneously fabricating the NMOS and PMOS transistors is described referring to FIGS. 7A to 7F.

FIGS. 7A to 7F are cross-sectional views describing a method for fabricating a transistor of a semiconductor device in accordance with another embodiment of the present invention.

Figure 7A:
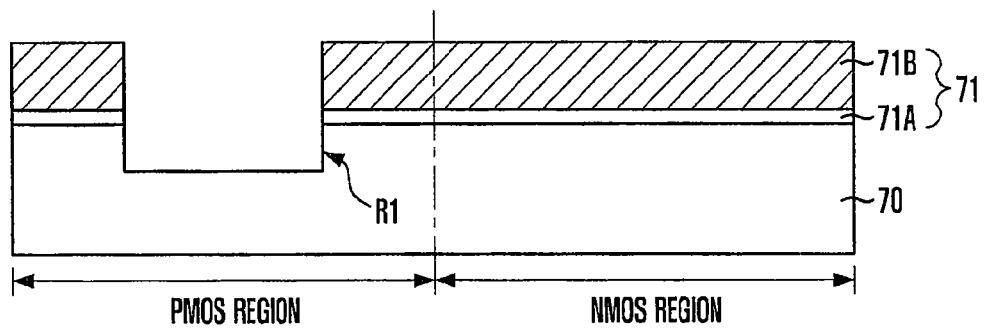
FIGS. 7A to 7F are cross-sectional views describing a method for fabricating a transistor of a semiconductor device in accordance with another embodiment of the present invention.

Referring to FIG. 7A, a hard mask layer is formed over a substrate 70 including PMOS and NMOS regions. The hard mask layer has a stack structure of an oxide layer and a nitride layer. The thickness of each of the oxide layer and the nitride layer ranges from approximately 50 Å to approximately 500 Å.

A portion of the hard mask layer is etched to form a hard mask pattern 71, including an oxide layer pattern 71A and a nitride pattern 71B, to expose a region where a channel region is to be formed in the PMOS region of the substrate 70. The exposed region of the substrate 70 is etched to a certain depth using the hard mask pattern 71 as an etch barrier to form a first recess R1 in the PMOS region of the substrate 70. The depth of the first recess R1 may range from approximately 300 Å to approximately 1,000 Å.

Figure 7B:
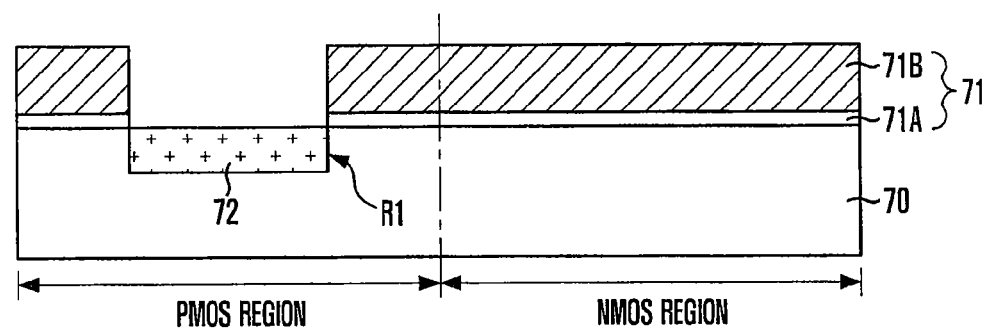

Referring to FIG. 7B, the substrate 70 with the first recess R1 is thermally treated in a $H_2$ atmosphere at a temperature higher than approximately 800° C. to remove a natural oxide layer generated when the first recess R1 is formed. A selective epitaxial growth process is performed to form a first epitaxial layer 72 for filling the first recess R1. The first epitaxial layer 72 includes a material having a smaller lattice constant than that of the substrate 70. The thickness of the first epitaxial layer 72 includes a material having a smaller lattice constant than the substrate 70. To be specific, when the substrate 70 is a Si substrate, the epitaxial layer 72 is a SiC epitaxial layer. Particularly, the content of the C in the SiC epitaxial layer may not be more than 2%. A SiC epitaxial layer formation process is performed using $SiH_4$, $Si_2H_6$, or $Si_2H_6$ as a Si source and $CH_4$ or $SiH_3(CH_3)$ as a C source. The thickness of the first epitaxial layer 72 may be substantially the same as that of the first recess R1.

Figure 7C:
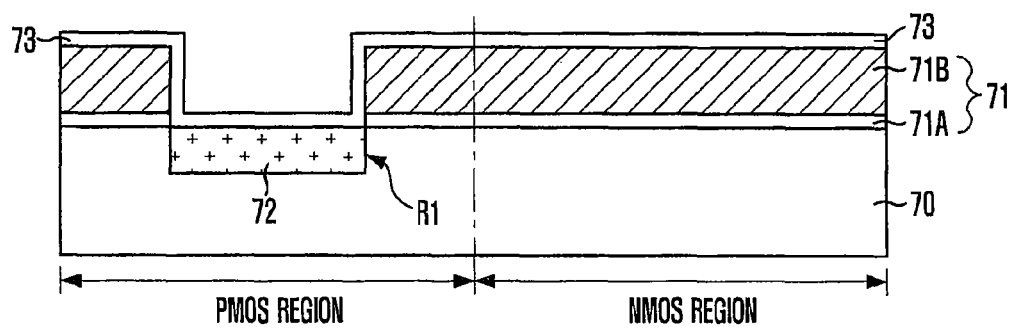

Referring to FIG. 7C, a capping layer 73 is formed over a resultant structure including the first epitaxial layer 72. The capping layer 73 protects the first epitaxial layer 72 in the subsequent processes for forming second recess and second epitaxial layer. The capping layer 73 may be an oxide layer.

Figure 7D:
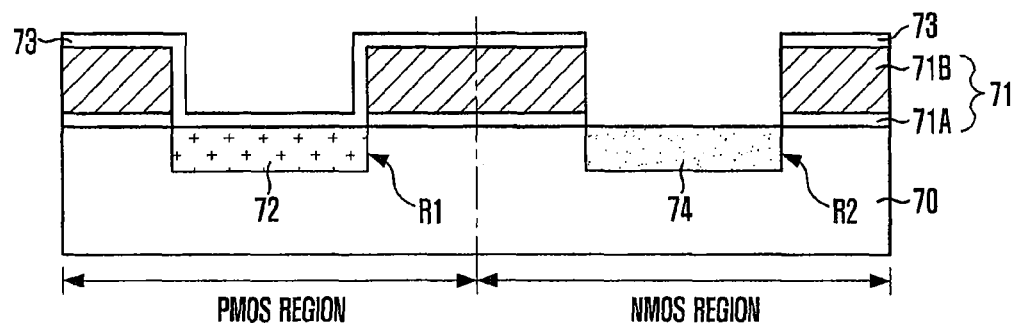

Referring to FIG. 7D, portions of the capping layer 73 and the hard mask layer 71 in the NMOS region are etched to form a hard mask pattern 71 for exposing a region where a channel region is to be formed in the NMOS region. The exposed substrate 70 is etched to a certain depth using the hard mask pattern 71 as an etch barrier to form a second recess R2 in the substrate 70 in the NMOS region. The depth of the second recess R2 may range from approximately 300 Å to approximately 1,000 Å.

The substrate 70 with the second recess R2 is thermally treated in a $H_2$ atmosphere at a temperature higher than approximately 800° C. to remove a natural oxide layer generated when the second recess R2 is formed. A selective epitaxial growth process is performed to form a second epitaxial layer 74 filling the second recess R2. The second epitaxial layer 74 includes a material having a greater lattice constant than that of the substrate 70. To be specific, when the substrate 70 is a Si substrate, the second epitaxial layer 74 may be a SiGe epitaxial layer. Particularly, the content amount of the Ge in the SiGe epitaxial layer may not be more than 50%. A SiGe formation process is performed using $SiH_4$, $Si_2H_6$, or $Si_2H_6$ as a Si source and $GeH_4$ as a Ge source. The thickness of the second epitaxial layer 74 may be substantially the same as that of the second recess R2.

Figure 7E:
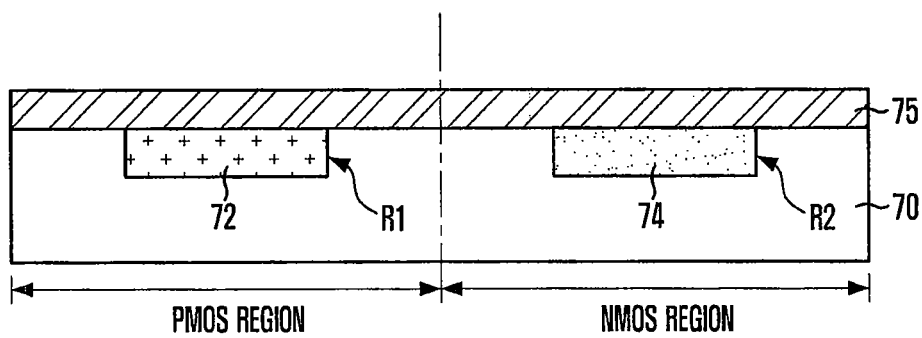

Referring to FIG. 7E, the capping layer 73, the oxide layer 71A, and the nitride layer 71B are removed using a wet chemical including $H_2PO_3$ and $H_2O_2$ or a wet chemical including HF.

An epitaxial substrate 75 is formed over the substrate 70 including the first epitaxial layer 72 and the second epitaxial layer 74. When the substrate 70 is a Si substrate, the epitaxial substrate 75 is a Si epitaxial layer. The thickness of the epitaxial substrate 75 may range from approximately 100 Å to approximately 500 Å. A source/drain region is formed in the epitaxial substrate 75. A channel region is formed between the source/drain regions. In the epitaxial substrate 75, the first epitaxial layer 72 is formed below the channel region in the PMOS region. The second epitaxial layer 74 is formed below the channel region in the NMOS region, thereby applying a stress to each channel region.

Figure 7F:
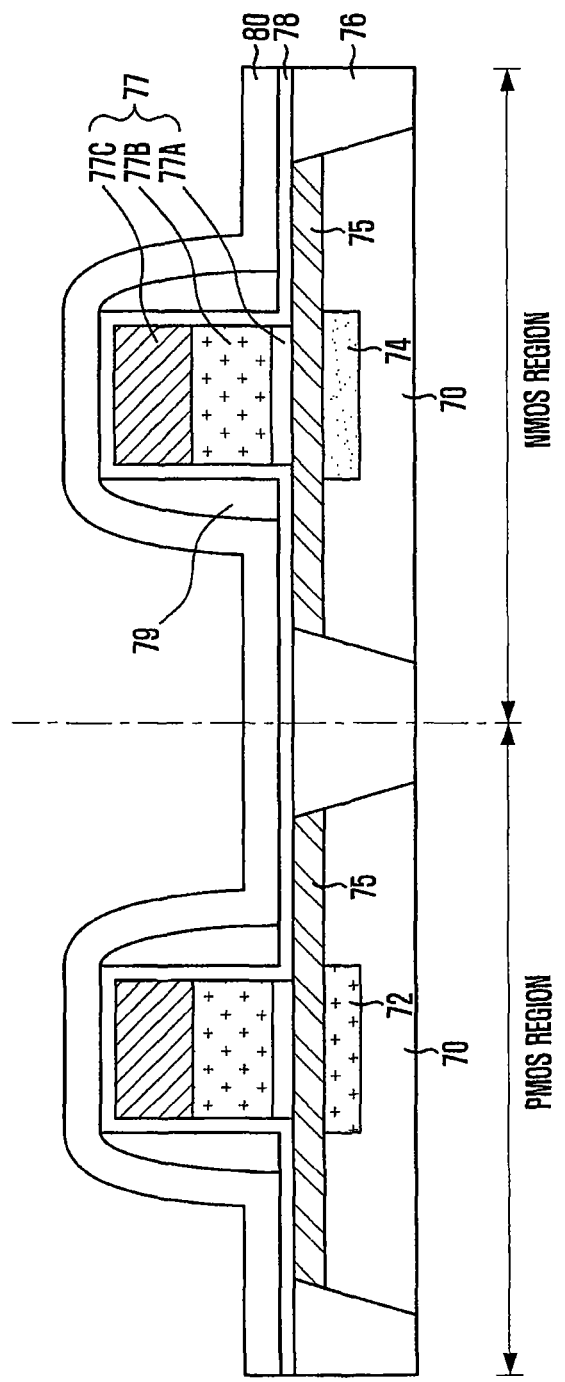

Referring to FIG. 7F, an isolation layer 76 is formed by an isolation process.

A gate 77 having a stack structure including a gate insulation layer 77A, a gate electrode 77B, and a gate hard mask layer 77C is formed over the channel region.

An etch stop layer 78 is formed along a profile of a resultant structure including the gate 77. The etch stop layer 78 prevents the substrate 70 from being damaged when a gate spacer formation process is performed. The etch stop layer 78 may include a nitride layer. However, the etch stop layer 78 may be omitted.

An insulation layer for a gate spacer is formed over the etch stop layer 78 and a spacer etch process is performed until the etch stop layer 78 is exposed, thereby forming gate spacers on sidewalls of the gate 77.

A stress layer 80 may be formed over a resultant structure including the gate 77 and the gate spacer 79, thereby applying an additive stress to the channel region. A $Si_3N_4$ layer having a compressive stress may be formed as the stress layer 80 over a resultant structure of the PMOS region. A $Si_3N_4$ layer having a tensile stress may be formed as the stress layer 80 over a resultant structure of the NMOS region.

In this invention, an epitaxial layer having a different lattice constant with a substrate material is formed below a channel region of a transistor to apply a stress to the channel region. Thus, the mobility of carriers of the transistor increases.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A transistor of a semiconductor device, comprising:
a silicon (Si) substrate, the substrate having a lattice constant;
an epitaxial substrate formed over and in contact with the Si substrate;
a gate formed over the epitaxial substrate;
source/drain regions formed in the epitaxial substrate, wherein a channel region is formed in the epitaxial substrate between the source/drain regions; and
an epitaxial layer formed in the Si substrate below the channel region, wherein the epitaxial layer has a different lattice constant than the Si substrate.

2. transistor of claim 1, wherein the transistor is a P-type metal oxide semiconductor (PMOS) transistor, and the epitaxial layer has a smaller lattice constant than the Si substrate and the epitaxial substrate.

3. The transistor of claim 2, wherein the epitaxial substrate is a Si epitaxial layer, and the epitaxial layer is a silicon carbide (SiC) epitaxial layer.

4. The transistor of claim 3, wherein an amount of C in the SiC layer is not more than 2%.

5. The transistor of claim 2, further comprising a compressive layer formed over the PMOS transistor.

6. The transistor of claim 1, wherein the transistor is an N-type metal oxide semiconductor (NMOS) transistor, and the epitaxial layer has a greater lattice constant than the Si substrate.

7. The transistor of claim 6, wherein the epitaxial substrate is a Si epitaxial layer, and the epitaxial layer is a silicon germanium (SiGe) layer.

8. The transistor of claim 7, wherein an amount of Ge in the SiGe epitaxial layer is not more than 50%.

9. The transistor of claim 6, further comprising a tensile stress layer formed over the NMOS transistor.

10. The transistor of claim 1, wherein the Si substrate has a surface direction and the channel region is formed in a direction perpendicular to the surface direction.

11. The transistor of claim 1, wherein a top surface of the epitaxial layer is in contact with the epitaxial substrate, and side and bottom surfaces of the epitaxial layer are surrounded by the Si substrate to be in contact with the Si substrate.

12. A semiconductor device, comprising:
a silicon (Si) substrate, the substrate having a lattice constant and including a PMOS region and an NMOS region;
an epitaxial substrate formed over and in contact with the Si substrate;
a plurality of gates formed over the epitaxial substrate;

a plurality of source/drain regions formed in the epitaxial substrate, wherein a channel region is formed in the epitaxial substrate between each source/drain region;

a first epitaxial layer formed in the Si substrate below each channel region of the PMOS region, wherein the first epitaxial layer has a smaller lattice constant than the Si substrate; and a second epitaxial layer formed in the Si substrate below each channel region of the NMOS region, wherein the second epitaxial layer has a greater lattice constant than the Si substrate, wherein a PMOS transistor is formed in the PMOS region and an NMOS transistor is formed in the NMOS region.

13. The device of claim 12, wherein the epitaxial substrate is a Si epitaxial layer, and the first epitaxial layer is a SiC epitaxial layer.

14. The device of claim 13, wherein an amount of C in the SiC layer is not more than 2%.

15. The device of claim 12, wherein the epitaxial substrate is a Si epitaxial layer, and the second epitaxial layer is a SiGe epitaxial layer.

16. The device of claim 15, wherein an amount of Ge in the SiGe epitaxial layer is not more than 50%.

17. The device of claim 15, wherein the Si substrate has a surface direction and each channel region is formed in a direction perpendicular to the surface direction.

18. The device of claim 12, further comprising a compressive layer formed over a resultant structure of the PMOS transistor.

19. The device of claim 12, further comprising a tensile stress layer formed over the NMOS transistor.

20. The transistor of claim 12, wherein top surfaces of the first and second epitaxial layers are in contact with the epitaxial substrate, and side and bottom surfaces of the first and second epitaxial layers are surrounded by the Si substrate to be in contact with the Si substrate.

* * * * *